United States Patent
Kang et al.

(10) Patent No.: US 10,659,023 B2
(45) Date of Patent: May 19, 2020

(54) APPARATUS AND METHOD FOR MULTIPLYING FREQUENCY

(71) Applicant: ELECTRONICS AND TELECOMMUNICATIONS RESEARCH INSTITUTE, Daejeon (KR)

(72) Inventors: Dongwoo Kang, Sejong-si (KR); Bon Tae Koo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/199,061

(22) Filed: Nov. 23, 2018

(65) Prior Publication Data
US 2019/0158078 A1 May 23, 2019

(30) Foreign Application Priority Data
Nov. 23, 2017 (KR) .................. 10-2017-0157571
Sep. 3, 2018 (KR) .................. 10-2018-0104669

(51) Int. Cl.
H03K 5/1252 (2006.01)
H03H 11/32 (2006.01)
H03K 5/00 (2006.01)
H03B 19/14 (2006.01)

(52) U.S. Cl.
CPC ........... H03K 5/1252 (2013.01); H03B 19/14 (2013.01); H03H 11/32 (2013.01); H03K 5/00006 (2013.01)

(58) Field of Classification Search
CPC combination set(s) only.
See application file for complete search history.

(56) References Cited

U.S. PATENT DOCUMENTS 3,993,956 A * 11/1976 Gilmore .............. H04L 27/2273
375/330
4,371,839 A * 2/1983 Rubin ................. H04L 27/2331
329/304
4,941,155 A * 7/1990 Chuang ................... H04L 7/007
375/330

(Continued)

FOREIGN PATENT DOCUMENTS

KR 10-2004-0001056 A 1/2004
KR 101325074 B1 11/2013

OTHER PUBLICATIONS

Ping-Han Tsai et al., "Broadband Balanced Frequency Doublers With Fundamental Rejection Enhancement Using a Novel Compensated Marchand Balun", IEEE Transactions on Microwave Theory and Techniques, vol. 61, No. 5, May 2013, pp. 1913-1923.

Primary Examiner — An T Luu
(74) Attorney, Agent, or Firm — Rabin & Berdo, P.C.

(57) ABSTRACT

An apparatus and a method for multiplying a frequency of an input signal are provided. The apparatus may include a main differential device for converting the input signal into a first differential signal and a second differential signal, a first multiplying device for outputting a first signal obtained by multiplying a frequency of the first differential signal, a second multiplying device for outputting a second signal obtained by multiplying a frequency of the second differential signal, and a compositing device for outputting a third signal obtained by combining the first signal and the second signal to remove a fundamental frequency component.

15 Claims, 9 Drawing Sheets

(56) References Cited

U.S. PATENT DOCUMENTS

| | | | | |
|---|---|---|---|---|
| 7,173,966 B2* | 2/2007 | Miller | .................. | H04K 1/00 |
| | | | | 375/229 |
| 7,443,826 B1* | 10/2008 | Atarius | ............... | H04B 1/7087 |
| | | | | 370/342 |
| 8,406,344 B2* | 3/2013 | Eitel | .................. | H03D 3/009 |
| | | | | 375/324 |
| 8,416,121 B2* | 4/2013 | Chen | .................. | G01S 13/34 |
| | | | | 342/103 |
| 8,786,330 B1 | 7/2014 | Chakraborty et al. | | |
| 9,921,170 B2* | 3/2018 | Pate | .................. | G01N 22/00 |
| 2014/0217831 A1 | 8/2014 | Hyoung et al. | | |
| 2017/0141763 A1 | 5/2017 | Moon et al. | | |

* cited by examiner

APPARATUS AND METHOD FOR MULTIPLYING FREQUENCY

CROSS-REFERENCE TO RELATED APPLICATION

This application claims priority to and the benefit of Korean Patent Applications Nos. 10-2017-0157571 and 10-2018-0104669 filed in the Korean Intellectual Property Office on Nov. 23, 2017 and Sep. 3, 2018, the entire contents of which are incorporated herein by reference.

BACKGROUND OF THE INVENTION (a) Field of the Invention

The present invention relates to an apparatus and a method for outputting a multiplied signal of which fundamental frequency components are removed.

(b) Description of the Related Art

A frequency multiplier is a device that applies a low frequency signal to a nonlinear element to obtain a high frequency signal. The frequency multiplier is necessary for generating a signal of the terahertz (THz) band or the millimeter wave (mmW) band of more than 10 GHz. The structure of the frequency multiplier implemented using active elements is shown FIG. 1.

Referring to FIG. 1, an input signal is converted into a differential signal by an active or passive element. Each of differential signals is input to transistors. When a bias of each of the transistors is placed near pinch-off, a drain or collector current of each of the transistors is output as a half-wave rectified signal. Since the half-wave rectified signals through each of the transistors have different phases from each other, a final output signal is a full-wave rectified signal obtained by combining the half-wave rectified signals. An ideal final output value is composed of even harmonic components (e.g., $2f_0$, $4f_0$, $6f_0$, ...).

It is difficult to generate an ideal differential signal when implementing an actual frequency multiplier. Further, since an amplitude or phase error occurs between two differential signals by active or passive elements, odd harmonic components (e.g., $f_0$, $3f_0$, ...) are also output. In the frequency multiplier implemented in this form, intensity of the fundamental frequency is higher than that of the $2f_0$ frequency by about −30 to −20 dB. To solve this problem, a filter is added, but this causes a loss of a secondary harmonic component.

SUMMARY OF THE INVENTION

According to an embodiment of the present disclosure there is provided an apparatus for outputting a multiplied signal of which fundamental frequency components are removed, the apparatus including: a main differential device for converting the input signal into a first differential signal and a second differential signal; a first multiplying device for outputting a first signal obtained by multiplying a frequency of the first differential signal; a second multiplying device for outputting a second signal obtained by multiplying a frequency of the second differential signal; and a compositing device for outputting a third signal obtained by combining the first signal and the second signal to remove a fundamental frequency component.

The first multiplying device and the second multiplying device may be connected in parallel between the main differential device and the compositing device.

The main differential device may be a balun or a transformer.

The first multiplying device may include a first differential device for converting the first differential signal received from the main differential device into a third differential signal and a fourth differential signal.

The second multiplying device may include a second differential device for converting the second differential signal received from the main differential device into a fifth differential signal and a sixth differential signal.

The first multiplying device may include a first transistor device for outputting a first rectified signal obtained by half-wave rectifying the third differential signal received from the first differential device and a second rectified signal obtained by half-wave rectifying the fourth differential signal received from the first differential device.

The second multiplying device may include a second transistor device for outputting a third rectified signal obtained by half-wave rectifying the fifth differential signal received from the second differential device and a fourth rectified signal obtained by half-wave rectifying the sixth differential signal received from the second differential device.

The first signal and the second signal may include the fundamental frequency component and a second harmonic component, and the fundamental frequency components of the first and second signals may differ in phase by 180 degrees from each other, and the second harmonic components of the first and second signals may be in phase with each other.

The first multiplying device may include a first summing device for outputting the first signal obtained by combining the first and second rectified signals received from the first transistor device.

The second multiplying device may include a second summing device for outputting the second signal obtained by combining the third and fourth rectified signal received from the second transistor device.

According to an embodiment of the present disclosure there is provided a method for outputting a multiplied signal of which fundamental frequency components are removed, the method including: converting, by a main differential device, the input signal into a first differential signal and a second differential signal; outputting, by a first multiplying device, a first signal obtained by multiplying a frequency of the first differential signal, and outputting, by a second multiplying device, a second signal obtained by multiplying a frequency of the second differential signal; and outputting, by a compositing device, a third signal obtained by combining the first signal and the second signal to remove a fundamental frequency component.

The first multiplying device and the second multiplying device may be connected in parallel between the main differential device and the compositing device.

The main differential device may be a balun or a transformer.

The outputting the first signal and the second signal may include: converting the first differential signal into a third differential signal and a fourth differential signal, and converting the second differential signal into a fifth differential signal and a sixth differential signal; and outputting a first signal obtained by combining first and second rectified signals obtained by half-wave rectifying the third differential signal and the fourth differential signal, respectively, and outputting a second signal obtained by combining third and fourth rectified signals obtained by half-wave rectifying the fifth differential signal and the sixth differential signal, respectively.

According to an embodiment of the present disclosure there is provided an apparatus for outputting a multiplied signal of which fundamental frequency components are removed, the apparatus including: a main differential device for converting the input signal into a first differential signal and a second differential signal; a first differential device connected to a top of an output terminal of the main differential device, and converting the first differential signal received from the main differential device into a third differential signal and a fourth differential signal; a second differential device connected to a bottom of the output terminal of the main differential device, and converting the second differential signal received from the main differential device into a fifth differential signal and a sixth differential signal; a first transistor device connected to an output terminal of the first differential device, and outputting first and second rectified signals obtained by half-wave rectifying the third and fourth differential signals, respectively; a second transistor device connected to an output terminal of the second differential device, and outputting third and fourth rectified signals obtained by half-wave rectifying the fifth and sixth differential signals, respectively; a first summing device connected to an output terminal of the first transistor device, and outputting the first signal obtained by combining the first and second rectified signal received from the first transistor device; a second summing device connected to an output terminal of the second transistor device, and outputting the second signal obtained by combining the third and fourth rectified signals received from the second transistor device; and a compositing device connected to output terminals of the first summing device and the second summing device, and outputting a third signal obtained by combining the first signal and the second signal to remove a fundamental frequency component.

The main differential device, the first differential device, and the second differential device may be baluns or transformers.

In one embodiment, the apparatus may include: a first amplifying device connected between the first differential device and the first transistor device, and amplifying the third differential signal and the fourth differential signal; and a second amplifying device connected between the second differential device and the second transistor device, and amplifying the fifth differential signal and the sixth differential signal.

DETAILED DESCRIPTION OF THE EMBODIMENTS

Figure 1:
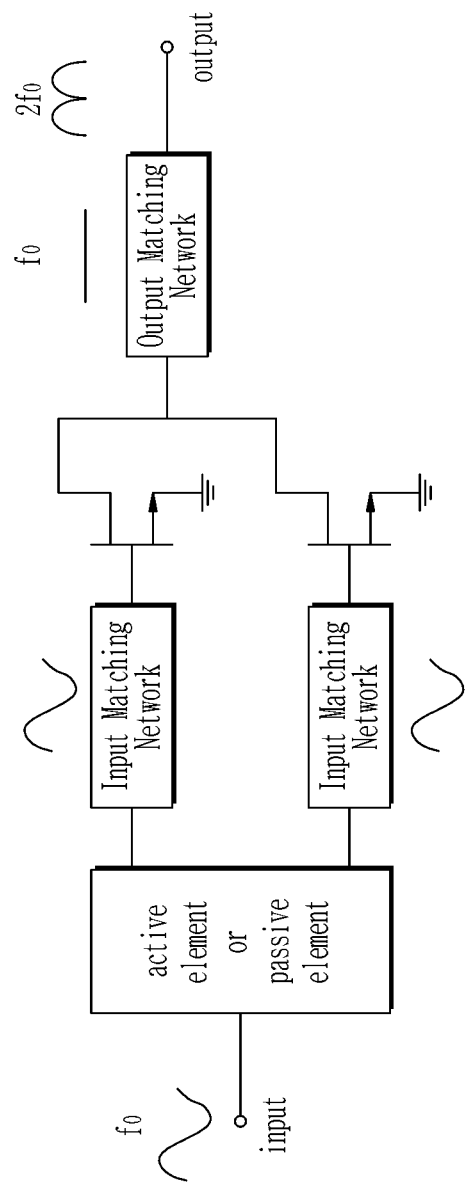
FIG. 1 is a schematic diagram illustrating a frequency multiplier.

Hereinafter, exemplary embodiments of the present disclosure will be described in detail with reference to the accompanying drawings so that those skilled in the art may easily practice the present disclosure. However, the present disclosure may be modified in various different ways, and is not limited to embodiments described herein. In the accompanying drawings, portions unrelated to the description will be omitted in order to obviously describe the present disclosure, and similar reference numerals will be used to describe similar portions throughout the present specification.

Throughout the present specification and the claims, unless explicitly described to the contrary, the word "comprise" and variations such as "comprises" or "comprising" will be understood to imply the inclusion of stated elements but not the exclusion of any other elements.

Figure 2:
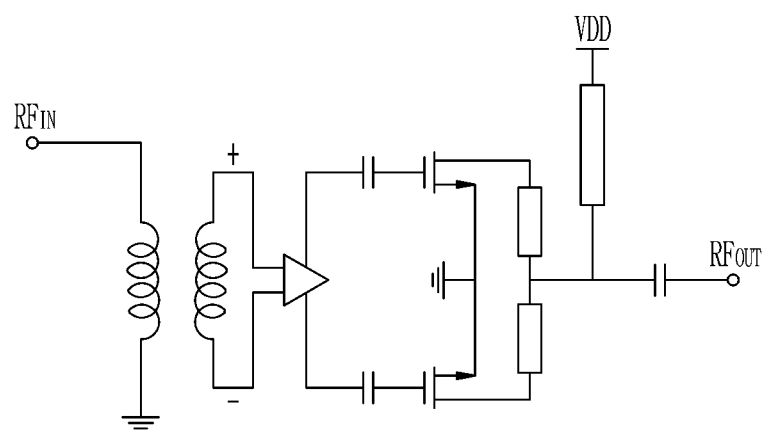
FIG. 2 is a circuit diagram of a balanced frequency multiplier according to an exemplary embodiment.

FIG. 2 is a circuit diagram of a balanced frequency multiplier according to an exemplary embodiment.

Referring to FIG. 2, an input signal $RF_{IN}$ may be divided into a differential signal by a transformer or a balun. The differential signal may be amplified by an amplifier or directly input to a multiplier.

A fundamental frequency component of the input signal $RF_{IN}$ is not completely removed unless the transformer is in an ideal state (e.g., a state in which the primary and secondary sides of the transformer are identical in size and do not differ in phase by 180 degrees).

Thus, when implementing an actual frequency multiplier, an amplitude error ($\varepsilon$) and a phase error ($\theta$) occur between upper and lower outputs due to the transformer or the balun.

The upper and lower outputs including the amplitude error and the phase error are shown in Equation 1.

$$I^+ = \frac{1}{2}\left(1+\frac{\varepsilon}{2}\right)\cos\left(\omega t + \frac{\theta}{2}\right) + \frac{2}{3\pi}\left(1+\frac{\varepsilon}{2}\right)\cos(2\omega t + \theta) + \ldots \quad \text{[Equation 1]}$$

$$I^- = \frac{-1}{2}\left(1-\frac{\varepsilon}{2}\right)\cos\left(\omega t - \frac{\theta}{2}\right) + \frac{2}{3\pi}\left(1-\frac{\varepsilon}{2}\right)\cos(2\omega t - \theta) + \ldots$$

When both the amplitude error ($\varepsilon$) and the phase error ($\theta$) become zero, fundamental frequency components ($\omega$) may be cancelled out because they have opposite phases to each other, and even harmonic components may be combined with each other because they have the same phase.

The amplitude and phase errors due to the transformer or the balun are normally within about 1 dB and within 5 degrees, respectively.

Due to the amplitude and phase errors, the output power of the fundamental frequency may be about 20 to 30 dB lower than the output power of the secondary harmonic frequency.

Figure 3:
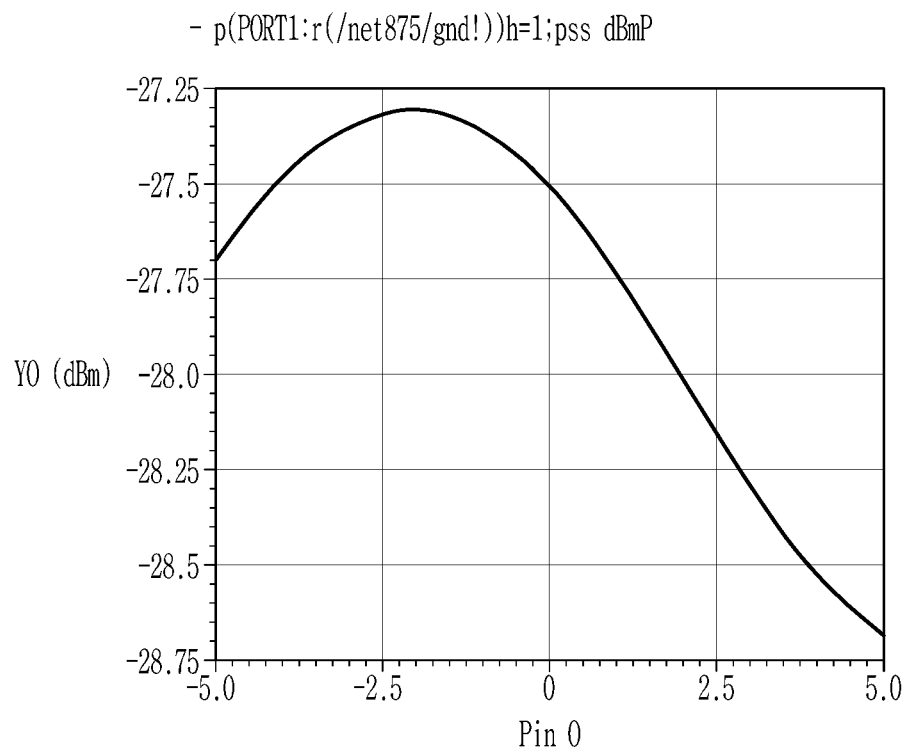
FIG. 3 is a graph illustrating output power of a fundamental frequency according to input power according to an exemplary embodiment.
Figure 4:
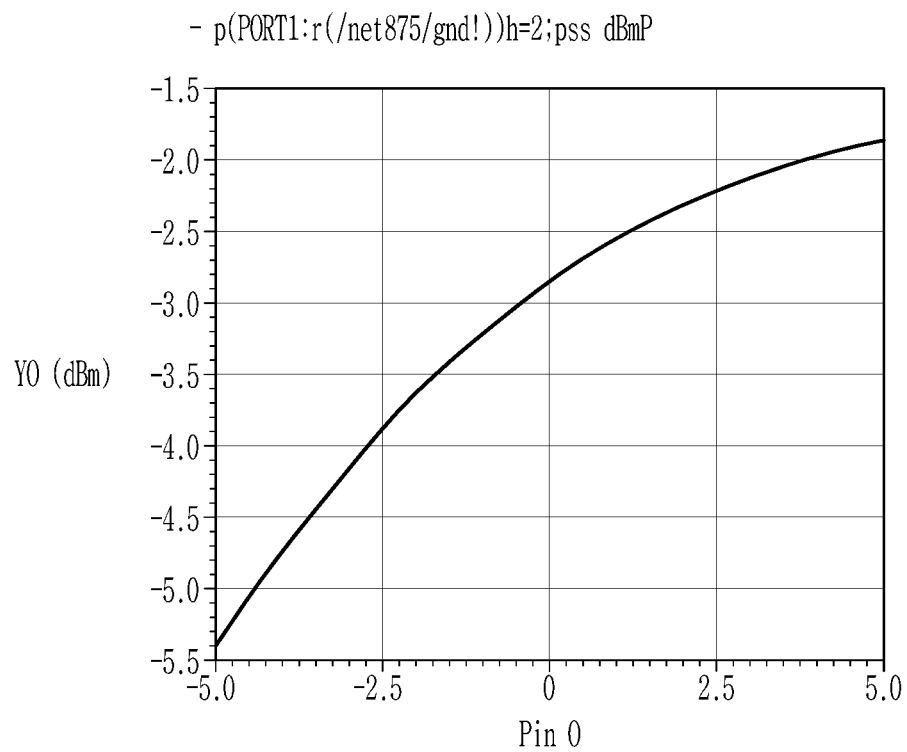
FIG. 4 is a graph illustrating output power of a multiplied frequency according to input power according to an exemplary embodiment.

FIG. 3 is a graph illustrating output power of a fundamental frequency according to input power (X-axis) according to an exemplary embodiment. FIG. 4 is a graph illustrating output power of a multiplied frequency according to input power (X-axis) according to an exemplary embodiment.

FIG. 3 is shows the output power of the fundamental frequency according to input power when the frequency multiplier is designed. FIG. 4 is a graph illustrating output power of a multiplied frequency according to input power when the frequency multiplier is designed.

In an exemplary embodiment, the input frequency may be 120 GHz and the output frequency may be 240 GHz.

Referring to FIG. 3 and FIG. 4, the output power of the fundamental frequency is about 25 dB lower than the output power of the multiplied frequency because of the amplitude and phase error that is caused by the transformer when implementing the actual frequency multiplier.

At this time, a filter for reducing the fundamental frequency component is required to reduce the difference of the output power between the fundamental frequency and the multiplied frequency.

Figure 5:
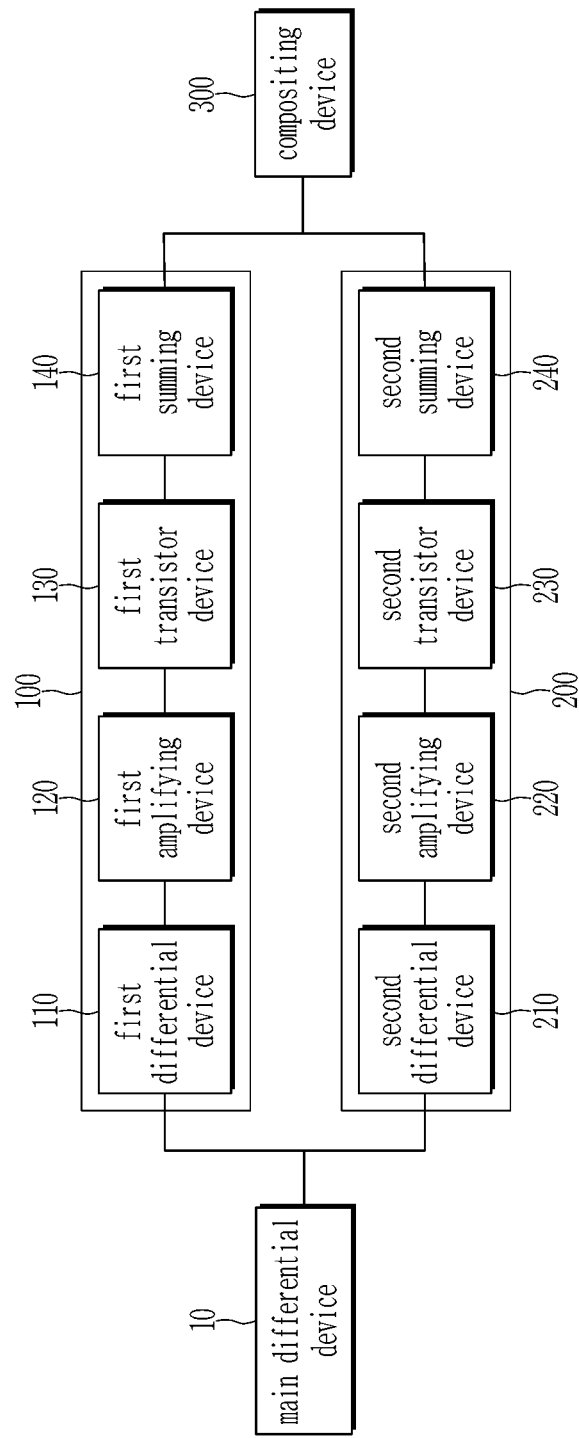
FIG. 5 is a block diagram of an apparatus for multiplying a frequency according to an exemplary embodiment.

FIG. 5 is a block diagram of an apparatus for multiplying a frequency according to an exemplary embodiment.

Referring to FIG. 5, an apparatus for multiplying a frequency according to an exemplary embodiment includes a main differential device 10, a first multiplying device 100, a second multiplying device 200, and a compositing device 300.

The main differential device 10 converts an input signal into a first differential signal and a second differential signal, and outputs the first differential signal and the second differential signal to the first multiplying device 100 and the second multiplying device 200.

The frequencies and amplitudes of the first differential signal and the second differential signal are equal to each other, and the phases of the first differential signal and the second differential signal are opposite to each other.

In an exemplary embodiment, the main differential device 10 may be a balun or a transformer.

The first multiplying device 100 outputs a first signal obtained by multiplying a frequency of the first differential signal received from the main differential device 10.

The first multiplying device 100 may include a first differential device 110, a first amplifying device 120, a first transistor device 130, and a first summing device 140.

The first differential device 110 converts the first differential signal received from the main differential device 10 into a third differential signal and a fourth differential signal.

In an exemplary embodiment, the first differential device 110 may be a balun or a transformer.

The first amplifying device 120 amplifies the third differential signal and the fourth differential signal.

The first transistor device 130 half-wave rectifies the third differential signal and the fourth differential signal received from the first amplifying device 120, respectively, and outputs the half-wave rectified signals to the first summing device 140.

The first transistor device 130 may include two transistors, it half-wave rectifies the third differential signal and the fourth differential signal through the two transistors, and outputs two signals to the first summing device 140.

The first summing device 140 combines the two signals received from the first transistor device 130, and outputs a first signal which is a multiplied signal.

The first signal may be include a fundamental frequency component and even harmonic components.

The second multiplying device 200 outputs a second signal obtained by multiplying a frequency of the second differential signal received from the main differential device 10.

The second multiplying device 200 may include a second differential device 210, a second amplifying device 220, a second transistor device 230, and a second summing device 240.

The second differential device 210 converts the second differential signal received from the main differential device 10 into a fifth differential signal and a sixth differential signal.

In an exemplary embodiment, the second differential device 210 may be a balun or a transformer.

The second amplifying device 220 amplifies the fifth differential signal and the sixth differential signal.

The second transistor device 230 half-wave rectifies the fifth differential signal and the sixth differential signal received from the second amplifying device 220, respectively, and outputs the half-wave rectified signals to the second summing device 240.

The second transistor device 230 may include two transistors, and half-wave rectifies the fifth differential signal and the sixth differential signal through the two transistors, and outputs two signals to the second summing device 240.

The second summing device 240 combines the two signals received from the second transistor device 230, and outputs a second signal which is a multiplied signal.

The second signal may be include a fundamental frequency component and even harmonic components.

The first multiplying device 100 and the second multiplying device 200 may be connected in parallel between the main differential device 10 and the compositing device 300.

The first multiplying device 100 and the second multiplying device 200 may have a balanced structure.

The compositing device 300 outputs a third signal obtained by combining the first signal and the second signal received from the first multiplying device 100 and a second multiplying device 200, respectively, to remove a fundamental frequency component and have only even harmonic components.

Since a phase difference of the fundamental frequency components of the first signal and the second signal is 180 degrees, the fundamental frequency components are cancelled out each other by the compositing device 300.

On the other hand, the even harmonic components of the first signal and the second signal are added to each other by the compositing device 300 because the phases of the even harmonic components of the first signal and the second signal are the same.

As a result, there is an effect that the fundamental frequency component is effectively minimized and that output power increases due to the combination of the even harmonic components.

Figure 6:
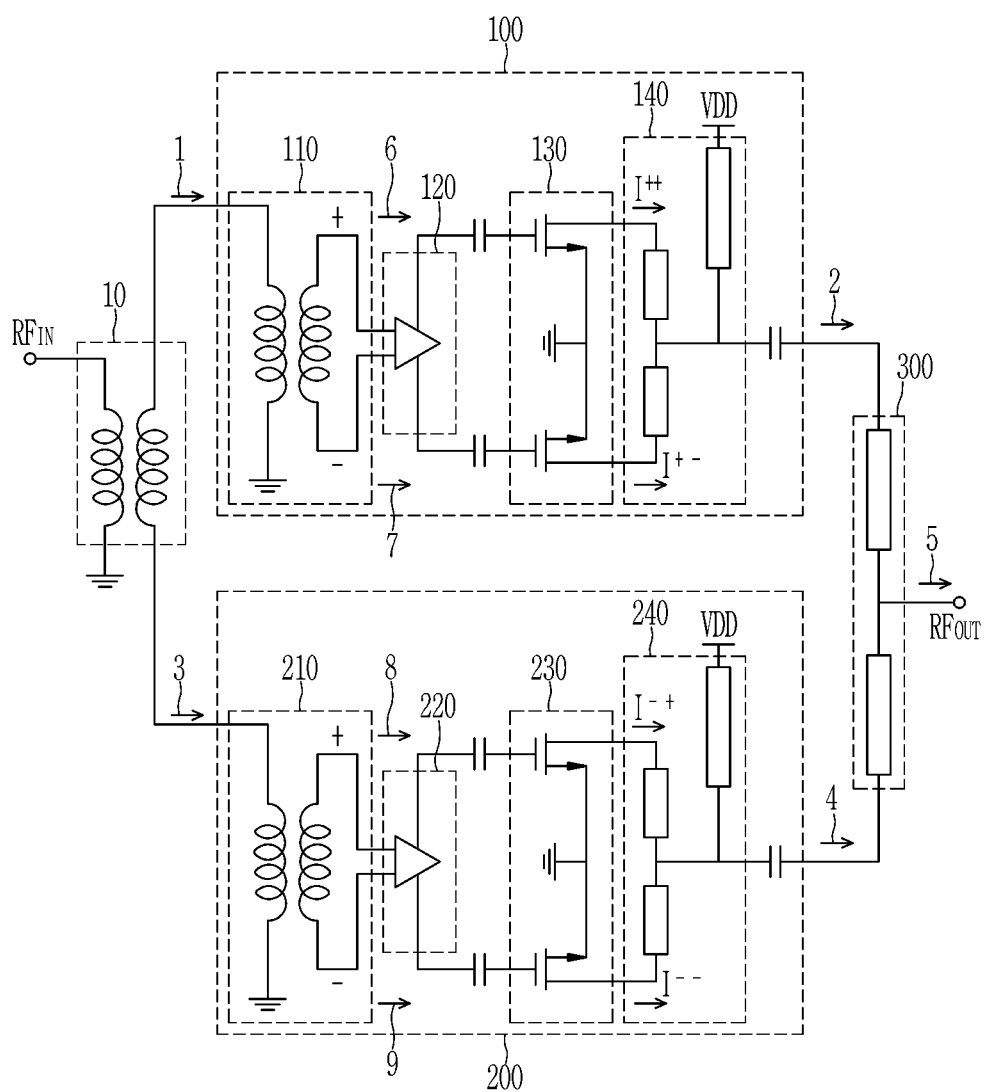
FIG. 6 is a circuit diagram of an apparatus for multiplying a frequency according to an exemplary embodiment.

FIG. 6 is a circuit diagram of an apparatus for multiplying a frequency according to an exemplary embodiment.

Referring to FIG. 6, an apparatus for multiplying a frequency according to an exemplary embodiment includes a main differential device 10, a first multiplying device 100, a second multiplying device 200, and a compositing device 300.

The main differential device 10 converts an input signal into a first differential signal 1 and a second differential signal 3, and outputs the first differential signal 1 and the second differential signal 3 to the first multiplying device 100 and the second multiplying device 200, respectively.

The first multiplying device 100 may include a first differential device 110, a first amplifying device 120, a first transistor device 130, and a first summing device 140.

The first differential device 110 is connected to a top of the output terminal of the main differential device 10, and converts the first differential signal 1 received from the main differential device 10 into a third differential signal 6 and a fourth differential signal 7.

The first transistor device 130 is connected to an output terminal of the first differential device 110, and outputs a first rectified signal $I^{++}$ and a second rectified signal $I^{+-}$ obtained by half-wave rectifying the third differential signal 6 and the fourth differential signal 7, respectively.

The first summing device 140 is connected to an output terminal of the first transistor device 130, and outputs a first signal 2 obtained by combining the first rectified signal $I^{++}$ and the second rectified signal $I^{+-}$ received from the first transistor device 130.

The first rectified signal $I^{++}$ is an upper drain current signal of the first transistor device 130, and the second rectified signal is a lower drain current signal of the first transistor device 130.

In an exemplary embodiment, the first transistor device 130 may include a bipolar junction transistor. The first rectified signal $I^{++}$ may be an upper collector current signal of the first transistor device 130, and the second rectified signal may be a lower collector current signal of the first transistor device 130.

The first rectified signal $I^{++}$ and the second rectified signal may be expressed by Equation 2.

$$I^{++} = \left(1 + \frac{\epsilon}{2}\right) \left[\frac{1}{2}\left(1 + \frac{\epsilon}{2}\right)\cos(\omega t + \theta) + \frac{2}{3\pi}\left(1 + \frac{\epsilon}{2}\right)\cos(2\omega t + 2\theta) + \ldots \right]$$

$$I^{+-} = \left(1 + \frac{\epsilon}{2}\right)\left[\frac{1}{2}\left(1 - \frac{\epsilon}{2}\right)\cos(\omega t + \pi) + \frac{2}{3\pi}\left(1 - \frac{\epsilon}{2}\right)\cos(2\omega t + 2\pi) + \ldots \right]$$

[Equation 2]

The first amplifying device 120 may be connected between the first differential device 110 and the first transistor device 130, and may amplify the third differential signal 6 and the fourth differential signal 7.

The second multiplying device 200 may include a second differential device 210, a second amplifying device 220, a second transistor device 230, and a second summing device 240.

The second differential device 210 is connected to a bottom of the output terminal of the main differential device 10, and converts the second differential signal 3 received from the main differential device 10 into a fifth differential signal 8 and a sixth differential signal 9.

The second transistor device 230 is connected to an output terminal of the second differential device 210, and outputs a third rectified signal $I^{-+}$ and a fourth rectified signal $I^{--}$ obtained by half-wave rectifying the fifth differential signal 8 and the sixth differential signal 9, respectively.

The second summing device 240 is connected to an output terminal of the second transistor device 230, and outputs a second signal 4 obtained by combining the third rectified signal $I^{-+}$ and the fourth rectified signal $I^{--}$ received from the second transistor device 230.

The third rectified signal $I^{-+}$ is an upper drain current signal of the second transistor device 230, and the fourth rectified signal $I^{--}$ is a lower drain current signal of the second transistor device 230.

In an exemplary embodiment, the second transistor device 230 may include a bipolar junction transistor. The third rectified signal $I^{-+}$ may be an upper collector current signal of the second transistor device 230, and the fourth rectified signal $I^{--}$ may be a lower collector current signal of the second transistor device 230.

The third rectified signal $I^{-+}$ and the fourth rectified signal $I^{--}$ may be expressed by Equation 3.

$$I^{-+} = \left(1 - \frac{\epsilon}{2}\right)\left[\frac{1}{2}\left(1 + \frac{\epsilon}{2}\right)\cos(\omega t + \pi) + \frac{2}{3\pi}\left(1 + \frac{\epsilon}{2}\right)\cos(2\omega t + 2\pi) + \ldots \right]$$

$$I^{--} = \left(1 - \frac{\epsilon}{2}\right)\left[\frac{1}{2}\left(1 - \frac{\epsilon}{2}\right)\cos(\omega t + 2\pi - \theta) + \frac{2}{3\pi}\left(1 - \frac{\epsilon}{2}\right)\cos(2\omega t + 4\pi - 2\theta) + \ldots \right]$$

[Equation 3]

The second amplifying device 220 may be connected between the second differential device 210 and the second transistor device 230, and may amplify the fifth differential signal 8 and the sixth differential signal 9.

The compositing device 300 is connected to output terminals of the first summing device 140 and the second summing device 240, and outputs a third signal 5 obtained by combining the first signal 2 and the second signal 4 to remove a fundamental frequency component.

Since a phase difference of the fundamental frequency components of the first signal 2 and the second signal 4 is 180 degrees and the phases of the even harmonic components of the first signal 2 and the second signal 4 are the same, the fundamental frequency components are cancelled out each other and the even harmonic components are added to each other.

Therefore, the third signal 5 includes only the even harmonic components.

In an exemplary embodiment, an apparatus for multiplying a frequency may further include a filter connected to an output terminal of the compositing device 300, which removes remaining harmonic components excluding the secondary harmonic component in the third signal 5.

Figure 7:
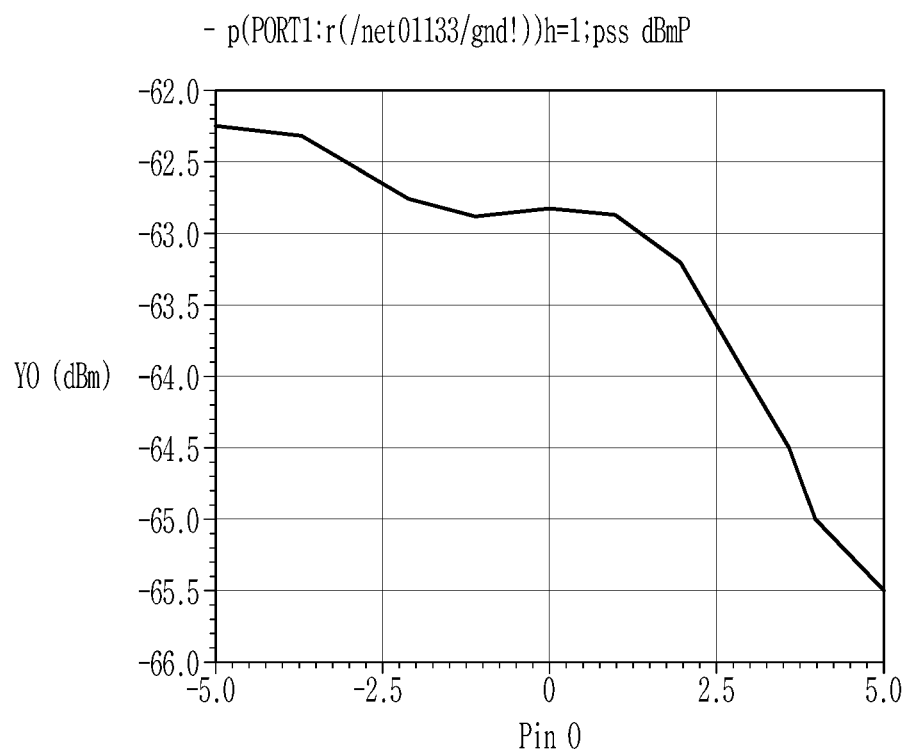
FIG. 7 is a graph illustrating output power of a fundamental frequency according to input power when the present disclosure is applied.
Figure 8:
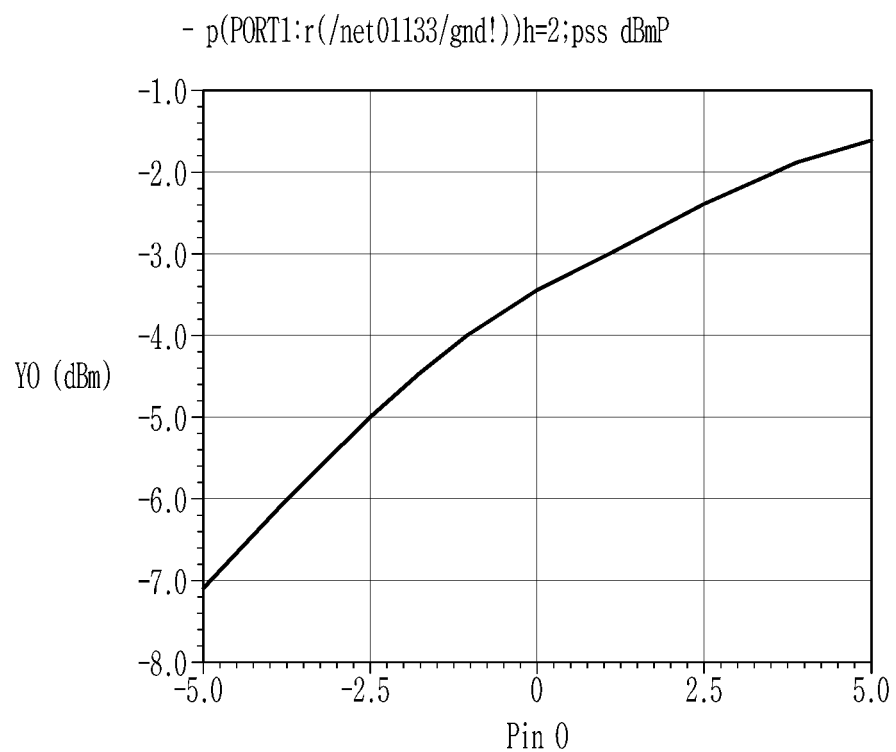
FIG. 8 is a graph illustrating output power of a multiplied frequency according to input power when the present disclosure is applied.

FIG. 7 is a graph illustrating output power of a fundamental frequency according to input power (X-axis) when an apparatus for multiplying a frequency of the present disclosure is designed by applying CMOS devices, and FIG. 8 is a graph illustrating output power of a multiplied frequency according to input power (X-axis) when an apparatus for multiplying a frequency of the present disclosure is designed by applying CMOS devices.

FIG. 7 shows the output power of the fundamental frequency according to input power when an apparatus for multiplying a frequency of the present disclosure is designed, and FIG. 8 shows the output power of a multiplied frequency according to input power when an apparatus for multiplying a frequency of the present disclosure is designed.

In an exemplary embodiment, the input frequency may be 120 GHz and the output frequency may be 240 GHz.

Referring to FIG. 7 and FIG. 8, the output power of the fundamental frequency is about 60 dB lower than the output power of the multiplied frequency.

According to the present disclosure, there is an effect that the output power of the fundamental frequency is lowered by about 35 dB or more compared with the output power of the traditional frequency multiplier.

In addition, there is an effect that the output power increases through the combination of the even harmonic components.

Figure 9:
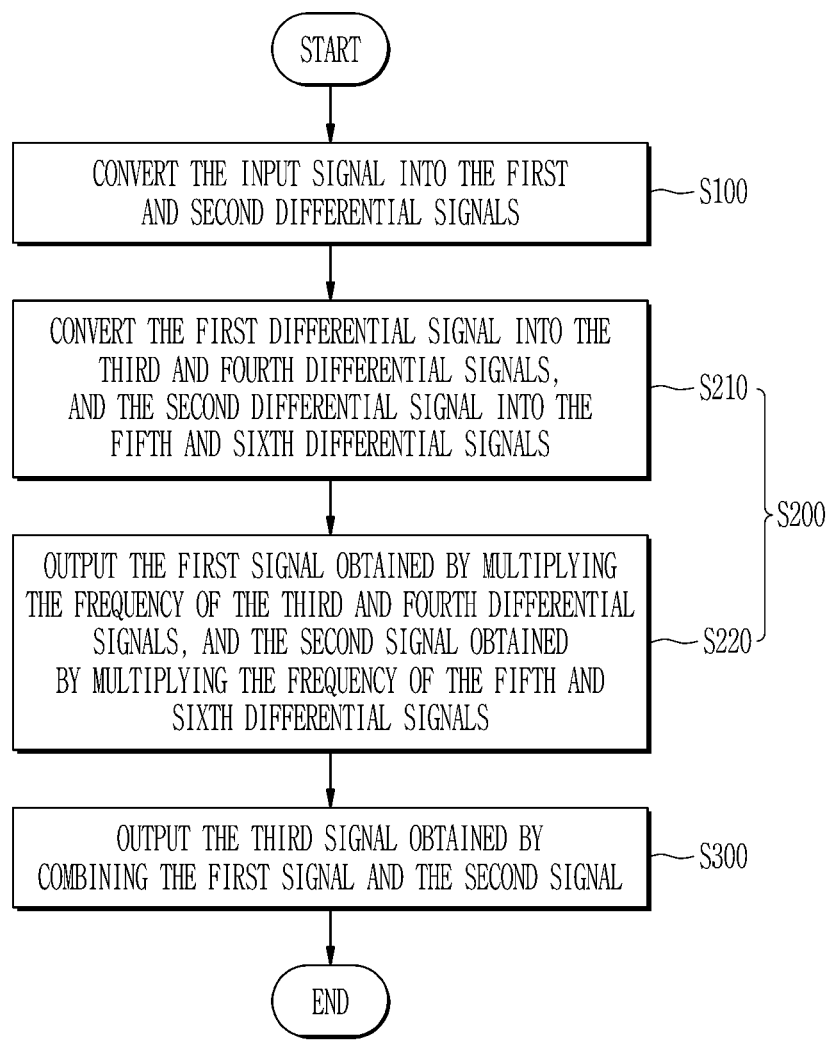
FIG. 9 is a flowchart of a method for multiplying a frequency according to an exemplary embodiment.

FIG. 9 is a flowchart of a method for multiplying a frequency according to an exemplary embodiment.

Referring to FIG. 9, a method for multiplying a frequency according to an exemplary embodiment includes converting, by a main differential device, the input signal into a first differential signal and a second differential signal, outputting, by a first multiplying device, a first signal obtained by multiplying a frequency of the first differential signal, and outputting, by a second multiplying device, a second signal obtained by multiplying a frequency of the second differential signal, and outputting, by a compositing device, a third signal obtained by combining the first signal and the second signal to remove a fundamental frequency component.

The outputting the first signal and the second signal may include converting the first differential signal into a third differential signal and a fourth differential signal and converting the second differential signal into a fifth differential signal and a sixth differential signal, and outputting a first signal obtained by combining first and second rectified signals obtained by half-wave rectifying the third differential signal and the fourth differential signal respectively, and outputting a second signal obtained by combining third and fourth rectified signals obtained by half-wave rectifying the fifth differential signal and the sixth differential signal, respectively.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for multiplying a frequency of an input signal, comprising:
   a main differential device for converting the input signal into a first differential signal and a second differential signal;
   a first multiplying device for outputting a first signal obtained by multiplying a frequency of the first differential signal;
   a second multiplying device for outputting a second signal obtained by multiplying a frequency of the second differential signal; and
   a compositing device for outputting a third signal obtained by combining the first signal and the second signal to remove a fundamental frequency component,
   wherein the main differential device is a balun or a transformer.

2. The apparatus of claim 1, wherein
   the first signal and the second signal include the fundamental frequency component and a second harmonic component, and the fundamental frequency components of the first and second signals differ in phase by 180 degrees from each other, and the second harmonic components of the first and second signals are in phase with each other.

3. The apparatus of claim 1, wherein
   the first multiplying device and the second multiplying device are connected in parallel between the main differential device and the compositing device.

4. The apparatus of claim 3, wherein
   the first multiplying device includes a first differential device for converting the first differential signal received from the main differential device into a third differential signal and a fourth differential signal.

5. The apparatus of claim 4, wherein
   the first multiplying device includes a first transistor device for outputting a first rectified signal obtained by half-wave rectifying the third differential signal received from the first differential device and a second rectified signal obtained by half-wave rectifying the fourth differential signal received from the first differential device.

6. The apparatus of claim 5, wherein
   the first multiplying device includes a first summing device for outputting the first signal obtained by combining the first and second rectified signals received from the first transistor device.

7. The apparatus of claim 3, wherein
   the second multiplying device includes a second differential device for converting the second differential signal received from the main differential device into a fifth differential signal and a sixth differential signal.

8. The apparatus of claim 7, wherein
   the second multiplying device includes a second transistor device for outputting a third rectified signal obtained by half-wave rectifying the fifth differential signal received from the second differential device and a fourth rectified signal obtained by half-wave rectifying the sixth differential signal received from the second differential device.

9. The apparatus of claim 8, wherein
   the second multiplying device includes a second summing device for outputting the second signal obtained by combining the third and fourth rectified signal received from the second transistor device.

10. A method for multiplying a frequency of an input signal, comprising:
    converting, by a main differential device, the input signal into a first differential signal and a second differential signal;
    outputting, by a first multiplying device, a first signal obtained by multiplying a frequency of the first differential signal, and outputting, by a second multiplying device, a second signal obtained by multiplying a frequency of the second differential signal; and
    outputting, by a compositing device, a third signal obtained by combining the first signal and the second signal to remove a fundamental frequency component,
    wherein the main differential device is a balun or a transformer.

11. The method of claim 10, wherein,
    the outputting the first signal and the second signal comprises:
    converting the first differential signal into a third differential signal and a fourth differential signal, and converting the second differential signal into a fifth differential signal and a sixth differential signal; and
    outputting a first signal obtained by combining first and second rectified signals obtained by half-wave rectifying the third differential signal and the fourth differential signal, respectively, and outputting a second signal obtained by combining third and fourth rectified signals obtained by half-wave rectifying the fifth differential signal and the sixth differential signal, respectively.

12. The method of claim 10, wherein
the first multiplying device and the second multiplying device are connected in parallel between the main differential device and the compositing device.

13. An apparatus for multiplying a frequency of an input signal, comprising:

a main differential device for converting the input signal into a first differential signal and a second differential signal;

a first differential device connected to a top of an output terminal of the main differential device, and converting the first differential signal received from the main differential device into a third differential signal and a fourth differential signal;

a second differential device connected to a bottom of the output terminal of the main differential device, and converting the second differential signal received from the main differential device into a fifth differential signal and a sixth differential signal;

a first transistor device connected to an output terminal of the first differential device, and outputting first and second rectified signals obtained by half-wave rectifying the third and fourth differential signals, respectively;

a second transistor device connected to an output terminal of the second differential device, and outputting third and fourth rectified signals obtained by half-wave rectifying the fifth and sixth differential signals, respectively;

a first summing device connected to an output terminal of the first transistor device, and outputting the first signal obtained by combining the first and second rectified signal received from the first transistor device;

a second summing device connected to an output terminal of the second transistor device, and outputting the second signal obtained by combining the third and fourth rectified signals received from the second transistor device; and a compositing device connected to output terminals of the first summing device and the second summing device, and outputting a third signal obtained by combining the first signal and the second signal to remove a fundamental frequency component.

14. The apparatus of claim 13, wherein
the main differential device, the first differential device, and the second differential device are baluns or transformers.

15. The apparatus of claim 13, further comprising:

a first amplifying device connected between the first differential device and the first transistor device, and amplifying the third differential signal and the fourth differential signal; and a second amplifying device connected between the second differential device and the second transistor device, and amplifying the fifth differential signal and the sixth differential signal.

* * * * *